(12) United States Patent  (10) Patent No.: US 11,887,854 B2
Li  (45) Date of Patent: Jan. 30, 2024

(54) SEMICONDUCTOR STRUCTURE MANUFACTURING METHOD AND TWO SEMICONDUCTOR STRUCTURES

(71) Applicant: CHANGXIN MEMORY TECHNOLOGIES, INC., Hefei (CN)

(72) Inventor: Yuan Li, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 133 days.

(21) Appl. No.: 17/496,927

(22) Filed: Oct. 8, 2021

(65) Prior Publication Data
US 2022/0223423 A1 Jul. 14, 2022

Related U.S. Application Data

(63) Continuation of application No. PCT/CN2021/105239, filed on Jul. 8, 2021.

(30) Foreign Application Priority Data

Jan. 14, 2021 (CN) .......................... 202110049137.6

(51) Int. Cl.
H01L 21/28 (2006.01)
H01L 21/285 (2006.01)
H01L 29/49 (2006.01)

(52) U.S. Cl.
CPC .... H01L 21/28518 (2013.01); H01L 29/4933 (2013.01)

(58) Field of Classification Search
CPC ... H01L 21/28; H01L 21/285; H01L 21/2855; H01L 21/28518; H01L 21/28008;
(Continued)

(56) References Cited

U.S. PATENT DOCUMENTS 5,963,829 A 10/1999 Matsubara
6,147,405 A 11/2000 Hu
(Continued)

FOREIGN PATENT DOCUMENTS

CN 1516900 A 7/2004
CN 1656605 A 7/2005
(Continued)

OTHER PUBLICATIONS

Translation of International Search Report in the international application No. PCT/CN2021/105239, dated Oct. 12, 2021.
(Continued)

Primary Examiner — Chuong A Luu
(74) Attorney, Agent, or Firm — Ladas & Parry LLP

(57) ABSTRACT

The present application provides a semiconductor structure manufacturing method and two semiconductor structures. The manufacturing method includes: providing a substrate and a silicon layer, the substrate exposing a top surface of the silicon layer; performing deposition to form an alloy layer on the silicon layer, the deposition being performed in a nitrogen-containing atmosphere, and a concentration of nitrogen atoms in the nitrogen-containing atmosphere increasing with an increase in deposition time; and annealing the alloy layer and the silicon layer. In embodiments of the present application, an increase in the concentration of nitrogen atoms can control a silicification reaction of the alloy layer, thereby preventing a line width effect and reducing the resistance of the semiconductor structure.

14 Claims, 5 Drawing Sheets

(58) Field of Classification Search
CPC ............. H01L 21/28556; H01L 21/768; H01L 21/76864; H01L 21/76867; H01L 29/45; H01L 29/49; H01L 29/456; H01L 29/4933
USPC ........................................ 438/197, 649, 655
See application file for complete search history.

(56) References Cited

U.S. PATENT DOCUMENTS

| | | | |
|---|---|---|---|
| 10,796,995 B2 | 10/2020 | Koike et al. | |
| 2003/0129831 A1 | 7/2003 | Hu | |
| 2004/0238845 A1* | 12/2004 | Hu | H01L 29/4941 257/199 |
| 2016/0053385 A1* | 2/2016 | Muro | C23F 1/26 438/669 |
| 2022/0122882 A1 | 4/2022 | Tang | |

FOREIGN PATENT DOCUMENTS

| | | |
|---|---|---|
| CN | 1966397 A | 5/2007 |
| CN | 101211771 A | 7/2008 |
| CN | 100554140 C | 10/2009 |
| CN | 105097503 A | 11/2015 |
| CN | 112864240 A | 5/2021 |
| CN | 114373714 A | 4/2022 |
| KR | 19990065713 A | 8/1999 |
| WO | 2022077992 A1 | 4/2022 |

OTHER PUBLICATIONS

Notice of Allowance of the Chinese application No. 202110049137.6, dated Apr. 6, 2022.

* cited by examiner

SEMICONDUCTOR STRUCTURE MANUFACTURING METHOD AND TWO SEMICONDUCTOR STRUCTURES

CROSS-REFERENCE TO RELATED APPLICATIONS

This application is a continuation of International Patent Application No. PCT/CN2021/105239, filed on Jul. 8, 2021, which claims priority to Chinese Patent Application No. 202110049137.6, filed on Jan. 14, 2021. The above-referenced patent applications are incorporated herein by reference in their entirety.

TECHNICAL FIELD

Embodiments of the present application relate to the field of semiconductors, and in particular, to a semiconductor structure manufacturing method and two semiconductor structures.

BACKGROUND

With the continuous development of the scale of integrated circuits, a feature size of a semiconductor structure is decreasing. According to a principle of scale down, a contact area of gate, source and drain structures decreases correspondingly. Contact resistance increases with a decrease in the contact area, which enables series resistance of the semiconductor structure to increase, and leads to the problems such as slowdown of operation and deterioration of amplification characteristics.

Therefore, metal silicide is generally used to form ohmic contact, so as to reduce the contact resistance. However, some metal silicide currently still has the problem of a line width effect or high resistance, which may reduce the performance of the semiconductor structure.

SUMMARY

The embodiments of the present application provide a semiconductor structure manufacturing method and two semiconductor structures, so as to solve the problems of the line width effect and high resistance of the metal silicide, thereby improving the performance of the semiconductor structure.

In order to solve the above problems, the embodiments of the present application provide a semiconductor structure manufacturing method, including: providing a substrate and a silicon layer, the substrate exposing a top surface of the silicon layer; performing deposition to form an alloy layer on the silicon layer, the deposition being performed in a nitrogen-containing atmosphere, and a concentration of nitrogen atoms in the nitrogen-containing atmosphere increasing with an increase in deposition time; and annealing the alloy layer and the silicon layer.

The embodiments of the present application further provide a semiconductor structure, including: a substrate and a silicon layer, the substrate exposing a top surface of the silicon layer; the silicon layer being provided with an alloy layer, the alloy layer containing nitrogen atoms, and the farther away from the silicon layer, the higher the content of the nitrogen atom.

The embodiments of the present application further provide a semiconductor structure, including: a substrate and a silicon layer, the substrate exposing a top surface of the silicon layer; the top surface of the silicon layer being provided with a metal silicide layer, the metal silicide layer containing nitrogen atoms, and the farther away from the silicon layer, the higher the content of the nitrogen atom.

BRIEF DESCRIPTION OF DRAWINGS

One or more embodiments are exemplarily described by using figures that are corresponding thereto in the accompanying drawings; the exemplary descriptions do not constitute limitations on the embodiments. Elements with same reference numerals in the accompanying drawings are similar elements. Unless otherwise particularly stated, the figures in the accompanying drawings do not constitute a scale limitation.

DESCRIPTION OF EMBODIMENTS

As can be seen from the BACKGROUND, the metal silicide currently still has the problems such as the line width effect and high resistance, and the performance of the semiconductor structure remains to be improved.

In order to improve the performance of the semiconductor structure, an alloy layer may react with silicon to form a metal silicide layer including a variety of metal silicide. Different metal silicide can complement one another to optimize the line width effect and reduce the resistance. However, due to a large difference in atomic radii of different metals in the alloy layer and a large difference in degrees of silicification reactions of various metals, a metal silicide layer finally formed is difficult to combine advantages of different metal silicide and weaken disadvantages of different metal silicide.

In order to solve the above problems, an embodiment of the present application provides a semiconductor structure manufacturing method, including: forming an alloy layer on a silicon layer, the alloy layer being deposited in a nitrogen-containing atmosphere, and a concentration of nitrogen atoms increasing with an increase in deposition time. The increase in the concentration of nitrogen atoms can control the silicification reaction of the alloy layer, so as to reduce the resistance of the metal silicide layer finally formed and prevent the line width effect, thereby improving the performance of the semiconductor structure. In addition, due to high electronegativity of the nitrogen atom, the nitrogen atom can also attract some metal atoms, so as to reduce the consumption of silicon atoms by the metal atoms to ensure electrical properties of the semiconductor structure.

In order to make objectives, technical solutions and advantages of the embodiments of the present application clearer, various embodiments of the present application will be described below in details with reference to the drawings. However, those of ordinary skill in the art may understand that, in the embodiments of the present application, numerous technical details are set forth in order to enable a reader to better understand the present application. However, the technical solutions claimed in the present application can be implemented without these technical details and various changes and modifications based on the embodiments below.

Figure 5:
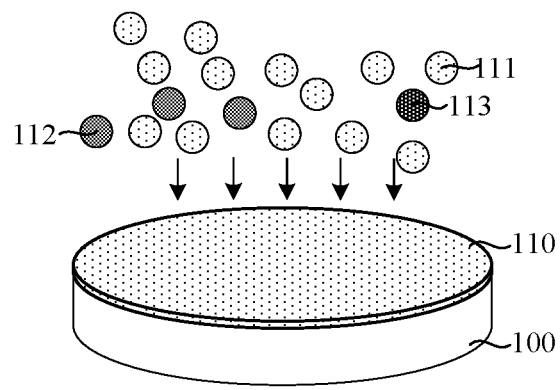
FIG. 5 is a schematic diagram of formation of an alloy layer in the semiconductor structure manufacturing method according to the first embodiment of the present application.
Figure 6:
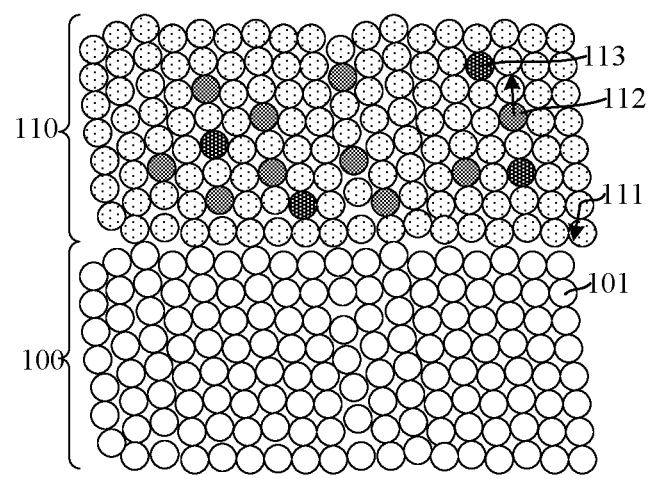
FIG. 6 is a partial structural diagram corresponding to the formation of the alloy layer in the semiconductor structure manufacturing method according to the first embodiment of the present application.
Figure 7:
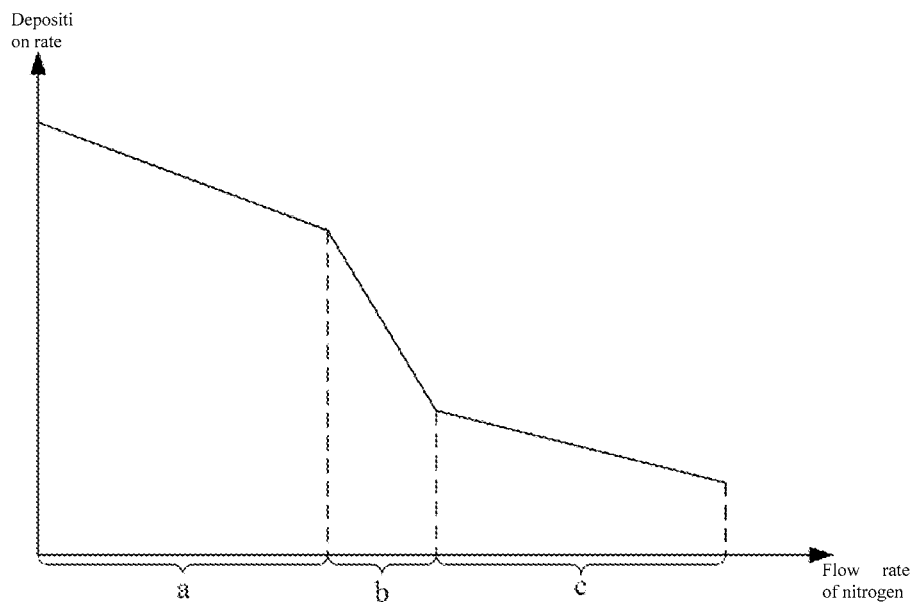
FIG. 7 is a line chart of changes in a deposition rate in the semiconductor structure manufacturing method according to the first embodiment of the present application.

A first embodiment of the present application provides a semiconductor structure manufacturing method. FIG. 1 to FIG. 4 are schematic structural diagrams corresponding to steps in a semiconductor structure manufacturing method according to a first embodiment of the present application; FIG. 5 is a schematic diagram of formation of an alloy layer in the semiconductor structure manufacturing method according to the first embodiment of the present application; FIG. 6 is a partial structural diagram corresponding to the formation of the alloy layer in the semiconductor structure manufacturing method according to the first embodiment of the present application; and FIG. 7 is a line chart of changes in a deposition rate in the semiconductor structure manufacturing method according to the first embodiment of the present application. Specific descriptions are given below with reference to the drawings.

Figure 1:
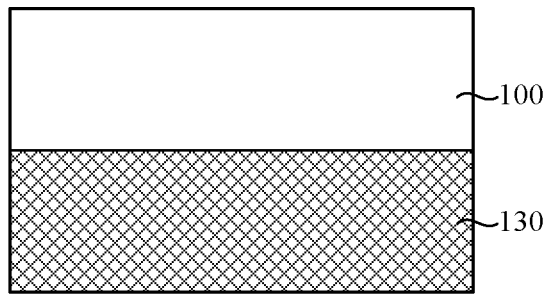
FIG. 1 to FIG. 4 are schematic structural diagrams corresponding to steps in a semiconductor structure manufacturing method according to a first embodiment of the present application.
Figure 2:
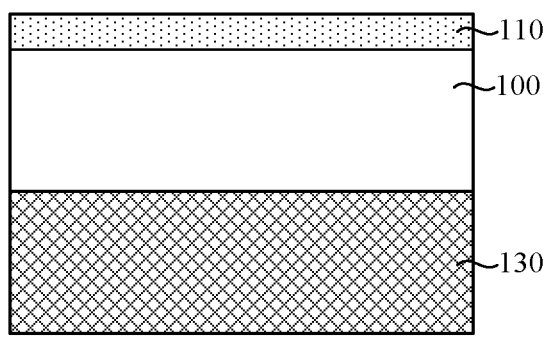

Referring to FIG. 1, the method includes: providing a substrate 130 and a silicon layer 100. The substrate 130 exposes a top surface of the silicon layer 100.

To reduce the oxidation of the substrate 130 and the silicon layer 100, a semiconductor structure may be placed in an environment of inert gas such as nitrogen.

The substrate 130 may be made of silicon, germanium, silicon on insulator, sapphire, silicon carbide, gallium arsenide, aluminum nitride, zinc silicon oxide or the like. The substrate 130 may include an isolation structure and an active region. The isolation structure may define a plurality of active regions. The isolation structure may be formed by filling shallow trenches with insulating materials; for example, the isolation structure may be a shallow trench isolation structure.

In this embodiment, the substrate 130 also has a gate dielectric layer on a surface, and the silicon layer 100 is located on the gate dielectric layer. The silicon layer 100 and a subsequently-formed alloy layer are configured to form a gate structure.

The silicon layer 100 is made of polysilicon, and the gate dielectric layer made of polysilicon and silicon oxide has high affinity and few interface defects. In addition, a threshold voltage and resistivity of the gate structure can be adjusted by doping polysilicon.

In other embodiments, the silicon layer may also be a source or drain structure. The silicon layer is located in the substrate and the substrate exposes a surface of the silicon layer. The silicon layer is made of monocrystalline silicon, and the silicon layer includes N-type or P-type doped ions. The subsequently-formed alloy layer is a contact structure of the source or drain structure.

In this embodiment, the method further includes the following step: performing surface treatment on the silicon layer 100 based on a plasma of a first gas and a plasma of a second gas. The first gas is configured to increase roughness of the surface of the silicon layer 100, and the first gas includes an inert gas; the second gas is configured to reduce an oxide on the surface of the silicon layer 100, and the second gas includes a reducing gas; and a flow rate of the first gas is greater than or equal to that of the second gas.

The use of the first gas can increase the roughness of the surface of the silicon layer 100, so as to increase a contact area between the silicon layer 100 and the subsequently-formed alloy layer, thereby reducing the contact resistance.

The oxide has high resistivity, and the use of the second gas to remove the oxide on the surface of the silicon layer 100 can reduce the contact resistance of the silicon layer 100 and the subsequently-formed alloy layer, so as to increase a driving current and reduce a delay effect.

The flow rate of the first gas is greater than or equal to that of the second gas based on a main reason below: the second gas bombards the surface of the silicon layer 100 with less strength, while the first gas bombards the surface of the silicon layer 100 with more strength. The flow rate of the first gas being greater than that of the second gas can improve the roughness of the surface of the silicon layer 100 to a large extent. In addition, when the bombardment strength is large, a number of ions bombarded increases accordingly, and a surface area of the silicon layer 100 also increases accordingly, which helps improve a reduction effect of the second gas on the bombarded ions and the surface of the silicon layer 100.

In this embodiment, a ratio of the flow rate of the first gas to the flow rate of the second gas is within a range of 1 to 20. In the above range, the first gas is guaranteed to have large bombardment strength on the surface of the silicon layer 100, excessive damages to the substrate 130 and the silicon layer 100 can be prevented, and the second gas can also be ensured to reduce the oxide sufficiently, thereby reducing the contact resistance of the silicon layer 100 and the subsequently-formed alloy layer.

In this embodiment, the first gas is argon. Argon has large bombardment strength and is cheap. In other embodiments, the first gas may also be helium.

In this embodiment, the second gas is hydrogen. Hydrogen is highly reductive and does not produce difficult-to-remove reaction byproducts. In other embodiments, the second gas may be ammonia.

A surface treatment temperature of the silicon layer 100 is controlled in a range of 150° C. to 350° C. A higher temperature can improve the activity of the second gas and then increase a removal rate of the oxide. In addition, the above temperature range is higher than the boiling point of water, which is conducive to increasing a removal rate of a volatile impurity such as water on the surface of the silicon layer 100.

Referring to FIG. 2 and FIG. 5 to FIG. 7, deposition is performed to form an alloy layer on the silicon layer 100, the deposition is performed in a nitrogen-containing atmosphere, and a concentration of nitrogen atoms in the nitrogen-containing atmosphere increases with an increase in deposition time.

That is, in the alloy layer 110, the further away from the silicon layer 100, the higher the nitrogen content. During subsequent annealing, in the alloy layer 110, the metal atoms with a high affinity for silicon atoms tend to diffuse towards the silicon layer 100, while the metal atoms with a low affinity for the silicon atoms tend to diffuse away from the silicon layer 100. Therefore, the metal atoms with a high affinity for the silicon atoms may cause greater silicon consumption, while the metal atoms with a low affinity for the silicon atoms may not have sufficient silicification reactions. The nitrogen atom is more electronegative, and the further away from the silicon layer 100, the higher the nitrogen content. As a result, the nitrogen atom becomes increasingly attractive in a direction away from the silicon layer 100. Therefore, the nitrogen atom can inhibit a diffusion degree of the metal atoms with a higher affinity for the silicon atoms to the silicon layer 100, thereby reducing silicon consumption. The metal atoms with a high affinity for the silicon atoms occupy fewer diffusion positions, while the metal atoms with a low affinity for the silicon atoms may occupy more diffusion positions towards the silicon layer 100, thereby improving a degree of the silicification reaction. In this way, the silicification reactions of various metals in the alloy layer 110 are relatively balanced, and the metal silicification layer finally formed may combine advantages of various metal silicides.

In this embodiment, the alloy layer 110 is a monolayer structure; that is, the alloy layer 110 has a relatively small thickness, and the alloy layer 110 has a small footprint. Subsequently, a thicker metal layer with low resistance may be formed on the alloy layer 110 to reduce the resistance of the semiconductor structure.

The alloy layer 110 is made of one or more combinations of titanium alloys. In this embodiment, the alloy layer 110 is made of a cobalt-titanium alloy, and a titanium atom 112 is reductive and can reduce residual oxides on the surface of the silicon layer 100. The titanium atom 112 can also improve the contact between a cobalt atom 111 and the surface the silicon layer 100, which facilitates the silicification reaction in a subsequent annealing process. In other embodiments, the alloy layer may also be made of a tungsten titanium alloy or a tantalum titanium alloy.

In the alloy layer 110, the content of titanium is no more than 10 at %. When the content of titanium is within a range of 1 to 10 at %, a ratio of titanium silicide to cobalt silicide in the metal silicide layer finally formed can be kept within a reasonable range, so that the metal silicide layer has no obvious line width effect and has low resistivity.

Since a radius of the cobalt atom 111 is similar to that of a silicon atom 10 land the radius of the titanium atom 112 is quite different from that of the silicon atom 101, in the subsequent annealing process, more cobalt atoms 111 tend to diffuse towards a direction close to the silicon layer 100, while more titanium atoms 112 tend to diffuse towards a direction away from the silicon layer 100. A nitrogen atom 113 is more electronegative than the silicon atom 101; when more nitrogen atoms 113 are distributed in a direction away from the silicon layer 100, the diffusion of the cobalt atoms 111 towards the direction close to the silicon layer 100 can be inhibited to a greater extent, that is, the nitrogen atom 113 can attract some of the cobalt atoms 111 to diffuse towards the direction away from the silicon layer 100, thereby inhibiting interaction between the cobalt atom 111 and the silicon atom 101. Since some of the cobalt atoms 111 may diffuse towards the direction away from the silicon layer 100, positions of some of the titanium atoms 112 may be occupied, so as to enable more titanium atoms 112 to diffuse towards the direction close to the silicon layer 100, thereby facilitating the formation of the titanium silicide. The titanium silicide has resistivity of 13 to 16 uΩ·cm, low resistance, a simple manufacturing process and good high-temperature stability. The cobalt silicide has no obvious line width effect under a 90 nanometer technology node. As a result, the metal silicide layer has low resistance and no obvious line width effect.

In addition, the nitrogen atom 113 has lower conductivity. When more nitrogen atoms 113 are distributed in the direction away from the silicon layer 100, the nitrogen atom 113 may not have a great influence on the ohmic contact between the silicon layer 100 and the alloy layer 110, so as to ensure low contact resistance between the silicon layer 100 and the alloy layer 110.

The forming of the alloy layer 110 is specifically described below.

The alloy layer 110 is formed by physical vapor deposition. Specifically, the alloy layer 110 is formed by reactive magnetron sputtering in physical vapor deposition. Reactive magnetron sputtering has the advantages of simple equipment, easy control, a large coating area and strong adhesion. Reactive magnetron sputtering takes a cobalt titanium alloy as a target cathode to react with nitrogen to form a nitrogen-containing alloy layer 110 in a film formation process of the silicon layer 100.

Distribution positions and nitrogen content of the nitrogen atoms 113 in the alloy layer 110 can be controlled by controlling the type, time and flow rate of an introduced nitrogen-containing gas.

In this embodiment, the nitrogen-containing gas is nitrogen which may not introduce other impurities and can prevent the impact on the performance of the semiconductor structure. In other embodiments, the nitrogen-containing gas may also be ammonia.

In this embodiment, during the formation of the alloy layer 110, the concentration of the nitrogen atom 113 in the nitrogen-containing atmosphere increases step by step. The step-by-step increase means that the concentration of the nitrogen atom 113 in a same time period is the same, but the concentration of the nitrogen atom 113 in different time periods is different and the concentration of the nitrogen atom 113 in a later time period is greater than that in a previous time period. In this way, in the formed alloy layer 110, the nitrogen content also increases step by step in a direction further away from the silicon layer 100. The step-by-step increase may reduce the setting of control parameters, thereby simplifying a manufacturing process.

In other embodiments, the concentration of nitrogen atoms in the nitrogen-containing atmosphere increases linearly. The linear increase means that the concentration of nitrogen atoms is different in a same time period, and the concentration of nitrogen atoms also increases with an increase in time. In this way, in the formed alloy layer, the nitrogen content also increases linearly in the direction further away from the silicon layer.

In addition, during the reactive magnetron sputtering, the content of cobalt and titanium atoms can be controlled by controlling the content of cobalt and titanium in the cobalt titanium alloy and magnitude of sputtering power.

It may be understood that an increase in the sputtering power can increase a sputtering rate and enable sputtered ions to have higher energy, thereby improving adhesion and density of a film. However, if the sputtering power is too large, the kinetic energy of the sputtered ions may be greatly increased, thereby causing damages to the film. In this embodiment, the sputtering power ranges from 3000 W to 4000 W. The sputtering power within the above range can ensure that the formed alloy layer 110 has greater adhesion and density, and can also prevent greater damages to the silicon layer 100.

In this embodiment, the deposition has a variable deposition rate, and the deposition rate decreases with an increase in the deposition time. The deposition rate refers to a film thickness of a material sputtered from a target material deposited on the silicon layer 100 in unit time, that is, a film thickness formed by deposition of the cobalt atom 111 and the titanium atom 112 on the silicon layer 100 in unit time.

The deposition rate is positively correlated with the sputtering rate which is affected by a surface state of the target material. The sputtering rate may be reduced if poisoning occurs in the target material. The poisoning of the target material means that a reaction gas reacts with a surface of the target material to form an impurity film. The impurity film is easy to produce cold field arc discharge, that is, an arcing phenomenon, so that cathode sputtering cannot proceed, thereby affecting a sputtering effect.

In this embodiment, the deposition rate decreases with an increase in the deposition time based on a main reason below: with an increase in the nitrogen concentration, the nitrogen atom may react with the surface of the target material; therefore, in order to keep the deposition rate constant, the sputtering rate should be increased to some extent; however, a large sputtering rate may cause damages to the target material, and the damages to the target material damage may deepen the poisoning of the target material. On the contrary, if the deposition rate is controlled to decrease with an increase in the deposition time, the sputtering rate can be kept in a low range, so as to reduce the damages to the target material to alleviate the poisoning of the target material, thereby preventing the influence on the sputtering effect.

Further, referring to FIG. 7, in this embodiment, the deposition rate has a three-stage change interval, and the deposition rates of the change intervals show a linear decreasing function relationship. Specifically, in this embodiment, the deposition rate has a first change interval a, a second change interval b and a third change interval c. The first change interval a corresponds to a metal mode, and the nitrogen content in the interval is minimum. The second change interval b corresponds to a transition mode, and the nitrogen content in this interval is greater than that in the previous interval. The third change interval c corresponds to a compound pattern (Co—Ti—N compound), and the nitrogen content in this interval is greater than that in the first two intervals. The deposition rates of the three change intervals show a linear decreasing function relationship, so the three change intervals enable the sputtering rate to be kept in a low range, so as to reduce the damages to the target material to alleviate the poisoning of the target material, thereby making the sputtering effect better in the three change intervals.

Linear decreasing functions of the deposition rates of the change intervals have different slopes. Specifically, a slope of the second change interval b is greater than that of the first change interval a, and the slope of the first change interval a is greater than that of the third change interval c. It may be understood that the smaller slope of the first change interval a can ensure that a target thickness of the film can be reached more quickly and can also prevent the poisoning of the target material to some extent; the maximum slope of the second change interval b can ensure that the sputtering rate can be rapidly reduced after the target thickness is reached, thereby greatly alleviating the poisoning of the target material under the high nitrogen concentration; the minimum slope of the third change interval c can ensure that a particular amount of sputtered ions bombard the surface of the film, thereby achieving a uniform nitrogen doping effect and also protecting the target material at a low sputtering rate.

During the reactive magnetron sputtering, argon is also introduced, and a flow rate of the argon ranges from 10 sccm to 80 sccm, which may be, for example, 20 sccm, 40 sccm or 70 sccm. Argon can be used as a discharge carrier and can also ensure that the semiconductor structure is in an inert gas atmosphere, thereby preventing the oxidation of the semiconductor structure.

A chamber pressure is controlled in a range of 0.0015 Torr to 0.0090 Torr, which may be, for example, 0.0030 Torr, 0.0050 Torr or 0.0080 Torr. The deposition rate and uniformity of the alloy layer 110 are correlated with the chamber pressure. When the chamber pressure is higher, the deposition rate is higher. However, the uniformity of the alloy layer 110 is greater when the chamber pressure is lower. When the chamber pressure is in the above range, the deposition rate can be accelerated to some extent and the uniformity of the alloy layer 110 can be guaranteed.

In other embodiments, the alloy layer may also be formed by physical vapor deposition such as vacuum evaporation or ion deposition.

Figure 3:
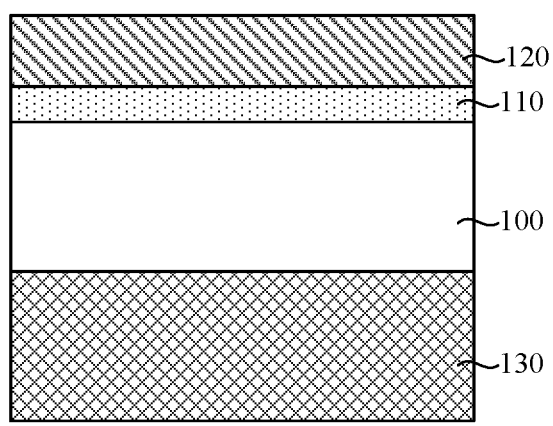

Referring to FIG. 3, the deposition further includes forming a metal layer 120 on the alloy layer 110.

Resistivity of the metal layer 120 is lower than that of the alloy layer 110, which can further reduce the resistance of the semiconductor structure and increase an operating speed of the semiconductor structure. For example, the metal layer 120 may be made of a material including a low-resistance metal such as tungsten, titanium, gold or silver.

In this embodiment, the metal layer 120 is formed by physical vapor deposition. In other embodiments, the metal layer may also be formed by chemical vapor deposition.

Figure 4:
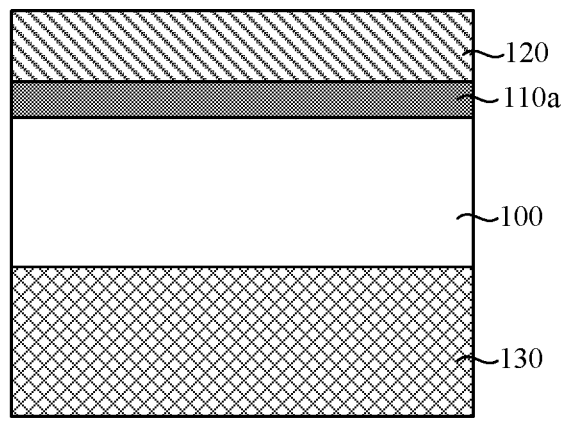

Referring to FIG. 4, the alloy layer 110 (refer to FIG. 3) and the silicon layer 100 are annealed to form a metal silicide layer 110a. In this embodiment, the substrate 130 and the metal layer 120 are also annealed.

The metal silicide layer 110a includes cobalt silicide, titanium silicide, titanium cobalt nitride, titanium silicon nitride and other substances. The metal silicide layer 110a may further include a cobalt titanium alloy not completely reacting. The titanium silicide has lower resistance, while the cobalt silicide can reduce the line width effect.

The metal silicide layer 110a finally formed contains nitrogen atoms, and in the metal silicide layer 110a, the farther away from the silicon layer 100, the higher the content of the nitrogen atom.

In other embodiments, the metal silicide layer may also include tantalum silicide, tungsten silicide, titanium tungsten nitride, titanium tantalum nitride and other substances. The metal silicide layer may further include a tantalum titanium alloy or a tungsten titanium alloy not completely reacting.

In a solid phase reaction of cobalt silicon, with the constant increase in the temperature, a formation phase sequence of cobalt silicide is as follows: dicobalt silicide $(Co_2Si) \rightarrow$ cobalt silicate $(CoSi) \rightarrow$ cobalt disilicide $(CoSi_2)$. During the formation of dicobalt silicide $(Co_2Si)$ and cobalt disilicide $(CoSi_2)$, cobalt atoms are motion atoms; while during the formation of cobalt silicate $(CoSi)$, silicon atoms are motion atoms. The increase in the concentration of the nitrogen atom can slow down the interdiffusion and interaction of cobalt and silicon, which is conducive to ordered growth of crystal lattice and can also reduce ohmic contact resistance and silicon consumption. In addition, the increase in the concentration of the nitrogen atom can also facilitate the formation of titanium silicide and further reduce the ohmic contact resistance.

An annealing temperature ranges from 500° C. to 900° C., which may be, for example, 600° C., 700° C. or 800° C. A higher annealing temperature can improve a migration rate of atoms. The annealing temperature in the above range can ensure the silicification reaction is more thorough and can prevent the problem of current leakage or short circuit caused by excessive silicon diffusion.

The time is controlled in a range of 10 s to 100 s, which may be, for example, 20 s, 30 s or 80 s. The annealing time in the above range can ensure the silicification reaction is more thorough and can prevent the problem of current leakage or short circuit caused by excessive silicon diffusion.

The annealing is performed in an argon atmosphere to prevent the oxidation of the semiconductor structure.

Based on the above, in the first embodiment of the present application, the alloy layer 110 is formed on a surface of the silicon layer, the alloy layer 110 is deposited in a nitrogen-containing atmosphere, and the concentration of nitrogen atoms in the nitrogen-containing atmosphere increases with an increase in deposition time. The increase in the concentration of the nitrogen atom 113 can control the silicification reaction process, so as to reduce the contact resistance and the line width effect of the metal silicification layer 110a and then improve the electrical properties and operating speed of the semiconductor structure.

Figure 12:
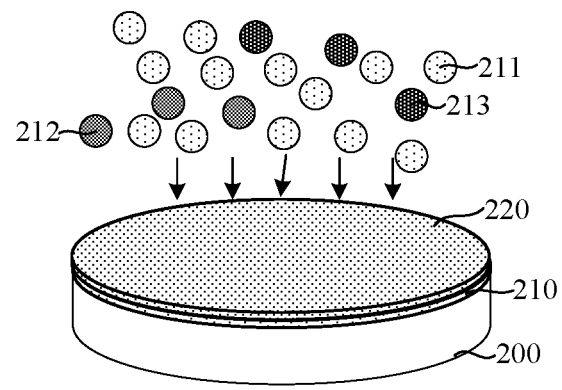
FIG. 12 is a schematic diagram of formation of a first alloy layer and a second alloy layer in the semiconductor structure manufacturing method according to the second embodiment of the present application.
Figure 13:
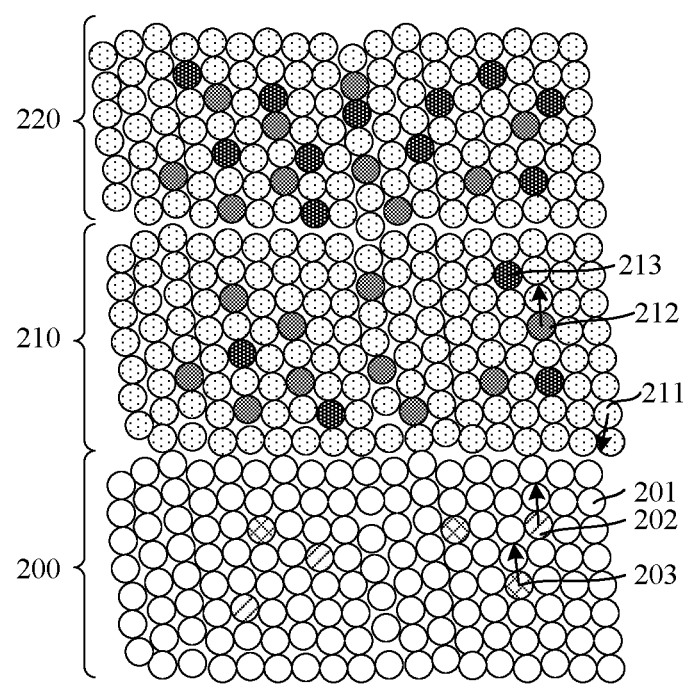
FIG. 13 is a partial structural diagram corresponding to the formation of the first alloy layer and the second alloy layer in the semiconductor structure manufacturing method according to the second embodiment of the present application.

A second embodiment of the present application provides a semiconductor structure manufacturing method. FIG. 8 to FIG. 11 are schematic structural diagrams corresponding to steps in a semiconductor structure manufacturing method according to a second embodiment of the present application; FIG. 12 is a schematic diagram of formation of a first alloy layer and a second alloy layer in the semiconductor structure manufacturing method according to the second embodiment of the present application; and FIG. 13 is a partial structural diagram corresponding to the formation of the first alloy layer and the second alloy layer in the semiconductor structure manufacturing method according to the second embodiment of the present application. Referring to FIG. 8 to FIG. 13, the manufacturing method according to the second embodiment is substantially the same as the method according to the first embodiment, and main differences are as follows: the deposition according to the second embodiment, as the two-stage deposition, includes first deposition and second deposition, the first deposition has first initial nitrogen atom concentration, the second deposition has a second initial nitrogen atom concentration, and the second initial nitrogen atom concentration is greater than the first initial nitrogen atom concentration.

The parts of the second embodiment the same as or similar to those of the first embodiment can be obtained with reference to the first embodiment and are not described in detail herein.

Specific description is given below with reference to the drawings.

Figure 8:
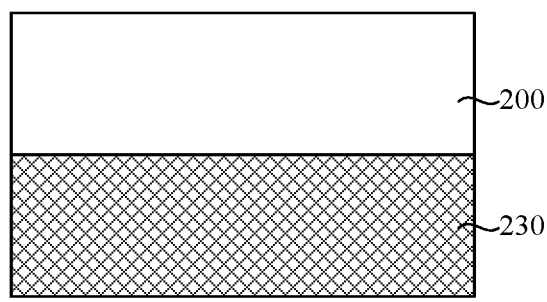
FIG. 8 to FIG. 11 are schematic structural diagrams corresponding to steps in a semiconductor structure manufacturing method according to a second embodiment of the present application.

Referring to FIG. 8, a substrate 230 and a silicon layer 200 are provided. The substrate 230 exposes a top surface of the silicon layer 200.

In this embodiment, the silicon layer 200 and subsequently formed first and second alloy layers are configured to form a gate structure. The silicon layer 200 contains doped atoms such as boron and phosphorus atoms. The boron and phosphorus atoms can increase the conductivity of the gate structure and regulate a threshold voltage of the gate structure.

In other embodiments, the silicon layer is configured to form a source structure or a drain structure. The boron or phosphorus atoms can provide holes or electrons for the source structure and the drain structure. When the gate structure is open, the source structure and the drain structure are switched on. The subsequently formed first and second alloy layers are contact structures of the source or drain structure.

Surface treatment is performed on the silicon layer 200 based on a plasma of a first gas and a plasma of a second gas, the first gas includes an inert gas, the second gas includes a reducing gas, and a flow rate of the first gas is greater than or equal to that of the second gas.

A specific description of the above steps can be obtained with reference to the first embodiment and is not described in detail here.

Figure 9:
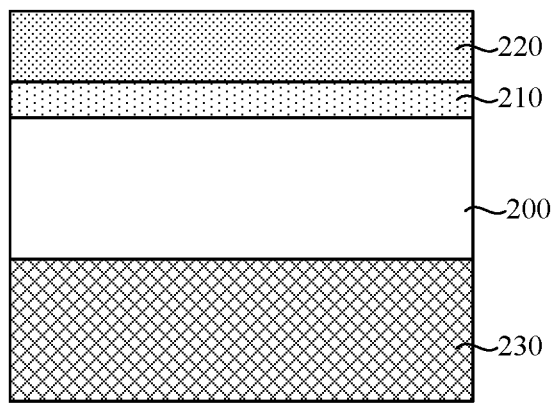

Referring to FIG. 9, FIG. 12 and FIG. 13, in this embodiment, the alloy layer is a double-layer structure, including a first alloy layer 210 and a second alloy layer 220. First deposition is performed on the first alloy layer 210 located on the silicon layer 200, and second deposition is performed on the second alloy layer 220 located on the first alloy layer 210; and the second initial nitrogen atom concentration is greater than the first initial nitrogen atom concentration.

The second initial nitrogen atom concentration is greater than the first initial nitrogen atom concentration based on a reason below: during the annealing, the doped atoms, such as a boron atom 202 and a phosphorus atom 203, tend to diffuse towards the first alloy layer 210 and the second alloy layer 220; the nitrogen atom 213 is chemically inert with the doped atoms such as the boron atom 202 and the phosphorus atom 203; therefore, a nitrogen concentration gradient of the second alloy layer 220 and the first alloy layer 210 can inhibit the diffusion of the boron atom 202 and the phosphorus atom 203 to a large extent, thereby reducing a variation degree of the threshold voltage of the gate structure.

In addition, the nitrogen concentration gradient of the second alloy layer 220 and the first alloy layer 210 can further reduce the silicon consumption to ensure the excellent electrical properties of the gate structure.

Besides, the nitrogen concentration gradient of the second alloy layer 220 and the first alloy layer 210 can also inhibit the diffusion of oxides on a surface of the silicon layer 200, so as to further reduce the resistance of a subsequently formed metal silicide layer.

In other embodiments, when the silicon layer is configured to form the source or drain structure, the nitrogen concentration gradient of the second metal layer and the first alloy layer can greatly inhibit the diffusion of the boron and phosphorus atoms, so that when the gate structure is open, conduction between the source and drain structures can be achieved; that is, enough electrons or holes pass between the source and drain structures.

In this embodiment, the first alloy layer 210 and the second alloy layer 220 are made of a same material, so as to reduce interface defects between them. The first alloy layer 210 and the second alloy layer 220 are both made of a cobalt titanium alloy.

In other embodiments, the first alloy layer and the second alloy layer may be made of different materials, which may be, for example, combinations of a cobalt titanium alloy, a tungsten titanium alloy and tantalum titanium alloy.

In this embodiment, in the first alloy layer 210, the further from the silicon layer 200, the higher the nitrogen content; and in the second alloy layer 220, the further from the silicon layer 200, the higher the nitrogen content. In this embodiment, the nitrogen content increases step by step. In other embodiments, the nitrogen content may also increase linearly.

The further from the silicon layer 200, the higher the nitrogen content, so that the diffusion of a cobalt atom 211 towards the direction of the silicon layer 200 can be inhibited to a greater extent, thereby reducing a reaction degree of cobalt silicon and reducing a degree of consumption of a silicon atom 201 by the cobalt atom 211. The decrease in the cobalt atom 211 diffusing towards the silicon layer 200 can provide more diffusion positions for a titanium atom 212, thereby facilitating the diffusion of the titanium atom 212 towards the silicon layer 200 to form more titanium silicon alloys.

In addition, the closer to the silicon layer 200, the lower the nitrogen content, so that the first alloy layer 210 and the second alloy layer 220 can form good ohmic contact with the silicon layer 200.

In other embodiments, the nitrogen content in the first alloy layer may be constant, and the nitrogen content in the second alloy layer may also be constant.

The formation of the first alloy layer 210 and the second alloy layer 220 is described in detail below.

The first alloy layer 210 and the second alloy layer 220 are formed by physical vapor deposition. Specifically, the first alloy layer 210 and the second alloy layer 220 are formed by reactive magnetron sputtering in physical vapor deposition.

Nitrogen is introduced during the formation of the first alloy layer 210, and nitrogen has a first flow rate, so that the first deposition has a first initial nitrogen atom concentration. Nitrogen is introduced during the formation of the second alloy layer 220, and nitrogen has a second flow rate, so that the second deposition has a second initial nitrogen atom concentration. The second flow rate is greater than the first flow rate, so that the second initial nitrogen atom concentration is greater than the first initial nitrogen atom concentration.

With the prolongation of the process time, the first flow rate increases and the second flow rate increases. In this embodiment, the first flow rate increases step by step, and the second flow rate increases step by step. In other embodiments, the first flow rate may increase linearly, and the second flow rate may increase linearly.

In other embodiments, the first flow rate and the second flow rate may also change with time, provided that the second flow rate is greater than the first flow rate.

In this embodiment, the first flow rate ranges from 1 sccm to 5 sccm, which may be, for example, 2 sccm, 3 sccm or 4 sccm; the second flow rate ranges from 3 sccm to 15 sccm, which may be, for example, 5 sccm, 7 sccm or 10 sccm. When the first flow rate and the second flow rate are in the above ranges, a reasonable nitrogen concentration gradient can be ensured between the first alloy layer 210 and the second alloy layer 220.

In this embodiment, the deposition has a variable deposition rate, and the deposition rate decreases with an increase in the deposition time. The deposition rate refers to a film thickness formed by deposition of the cobalt atom 211 and the titanium atom 212 on the silicon layer 200 in unit time.

The deposition rate is positively correlated with the sputtering rate which is affected by a surface state of the target material. The sputtering rate may be reduced if poisoning occurs in the target material.

In this embodiment, the deposition rate decreases with an increase in the deposition time based on a main reason below: if the deposition rate is controlled to decrease with an increase in the deposition time, the sputtering rate can be kept in a low range, so as to reduce the damages to the target material to alleviate the poisoning of the target material, thereby preventing the influence on the sputtering effect.

Further, in this embodiment, the deposition rate has a three-stage change interval, and the deposition rates of the change intervals show a linear decreasing function relationship. The three change intervals enable the sputtering rate to be kept in a low range, so as to reduce the damages to the target material to alleviate the poisoning of the target material, thereby making the sputtering effect better in the three change intervals.

Linear decreasing functions of the deposition rates of the change intervals have different slopes. Specifically, the small slope of the first change interval a can ensure that a target thickness of the film can be reached relatively quickly and can also prevent the poisoning of the target material to some extent; the maximum slope of the second change interval b can ensure that the sputtering rate can be rapidly reduced after the target thickness is reached, thereby greatly alleviating the poisoning of the target material under the high nitrogen concentration; the minimum slope of the third change interval c can ensure that a particular amount of sputtered ions bombard the surface of the film, thereby achieving a uniform nitrogen doping effect and also protecting the target material at a low sputtering rate.

Refer to the first embodiment for a detailed description of the change process of the deposition rate. In addition, it is to be noted that, in this embodiment, the first deposition and the second deposition have the above three change intervals.

During the formation of the first alloy layer 210, the sputtering power ranges from 3000 W to 4000 W, a flow rate of argon ranges from 10 sccm to 80 sccm, and a chamber pressure is controlled in a range of 0.0015 Torr to 0.0090 Torr.

During the formation of the second alloy layer 220, the sputtering power ranges from 3000 W to 4000 W, the flow rate of argon ranges from 10 sccm to 80 sccm, and the chamber pressure is controlled in the range of 0.0015 Torr to 0.0090 Torr.

Figure 10:
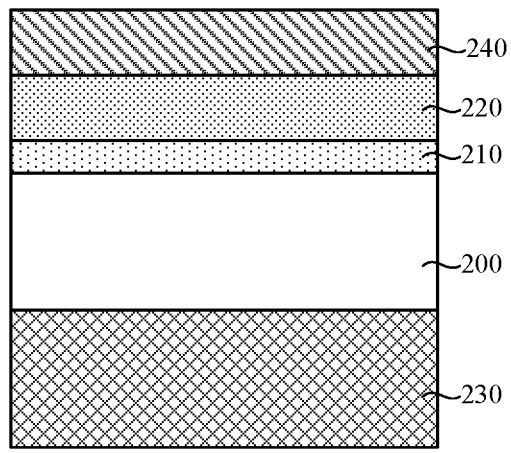

Referring to FIG. 10, the deposition further includes forming a metal layer 240 on the alloy layer. In this embodiment, the metal layer 240 is located on the second alloy layer 220. Refer to the first embodiment for a detailed description of the metal layer 240.

Figure 11:
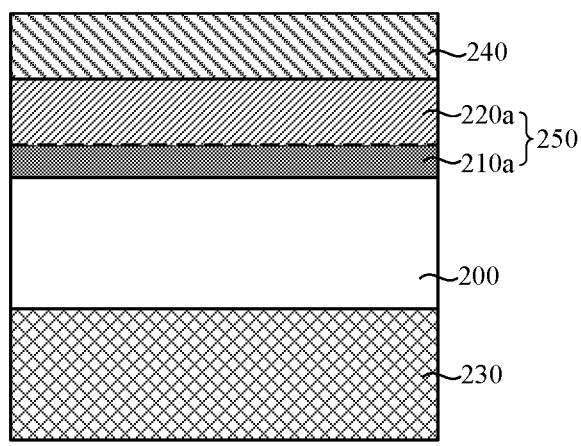

Referring to FIG. 11, the first alloy layer 210 (refer to FIG. 10), the second alloy layer 220 (refer to FIG. 10) and the silicon layer 200 are annealed to form a metal silicide layer 250. The metal silicide layer 250 can greatly reduce the contact resistance and then increase the operating speed of the semiconductor structure.

The metal silicide layer 250 includes a first region 210*a* and a second region 220*a*. Since the first region 210*a* is closer to the silicon layer 200, the content of the metal silicide in the first region 210*a* is higher than that in the second region 220*a*.

The metal silicide layer 250 mainly includes titanium silicide, cobalt silicide, titanium cobalt nitride, titanium nitride, a cobalt titanium alloy and other substances.

Based on the above, the gradient nitrogen content of the second alloy layer 220 and the first alloy layer 210 can reduce the diffusion degree of the doped ions such as boron and phosphorus atoms towards the first alloy layer 210 and the second alloy layer 220, so as to ensure good electrical properties of the semiconductor structure.

A third embodiment of the present application provides a semiconductor structure. FIG. 10 is a schematic diagram of the semiconductor structure. Referring to FIG. 10, the semiconductor structure includes: a substrate 230 and a silicon layer 200, the substrate 230 exposing a top surface of the silicon layer 200; the silicon layer 200 being provided with an alloy layer.

The silicon layer 200 and the alloy layer are configured to form a gate structure. In other embodiments, the silicon layer may be configured to form a source or drain structure, and the alloy layer is configured to form a contact structure of the source or drain structure.

The alloy layer contains nitrogen atoms in the alloy layer, and the further away from the silicon layer 200, the higher the content of nitrogen atoms. In this embodiment, the alloy layer is a double-layer structure, including a first alloy layer 210 and a second alloy layer 220 sequentially stacked, and nitrogen content of the second alloy layer 220 is greater than that of the first alloy layer 210.

The nitrogen concentration gradient of the first alloy layer 210 and the second alloy layer 220 can inhibit the diffusion of doped ions such as boron and phosphorus atoms in the silicon layer 200 towards the first alloy layer 210 and the second alloy layer 220, thereby ensuring good electrical properties of the semiconductor structure.

In the first alloy layer 210 and the second alloy layer 220, the further away from the silicon layer 200, the higher the content of nitrogen atoms. The increase in the nitrogen content can control the silicification reaction of the first alloy layer 210 and the second alloy layer 220, so as to reduce the contact resistance and prevent the line width effect of the metal silicide layer finally formed, thereby improving the performance of the semiconductor structure.

In other embodiments, the nitrogen atoms in the first alloy layer and the second alloy layer may also be evenly distributed, provided that the nitrogen content in the second alloy layer is greater than that in the first alloy layer.

The nitrogen content in the first alloy layer 210 ranges from 1 at % to 5 at %, and the nitrogen content in the second alloy layer 220 is no more than 7 at %. That is, a difference between the nitrogen content of the first alloy layer 210 and the nitrogen content of the second alloy layer 220 ranges from 2 at % to 6 at %, which may be, for example, 3 at %, 4 at % or 5 at %. The difference between the nitrogen content in the above range can inhibit the diffusion of the doped atoms to a greater extent, and can also reduce the influence of the nitrogen atoms on the resistance of the first alloy layer 210 and the second alloy layer 220.

In other embodiments, the alloy layer may also be a monolayer structure; that is, the first alloy layer may not be provided with the second alloy layer.

Based on the above, the nitrogen concentration gradient of the first alloy layer 210 and the second alloy layer 220 can reduce the diffusion of the doped ions in the silicon layer 200; and the increase in the nitrogen content in the first alloy layer 210 and the second alloy layer 220 can control the silicification reaction of the first alloy layer 210 and the second alloy layer 220, thereby reducing the contact resistance and preventing the line width effect.

A fourth embodiment of the present application provides a semiconductor structure. The semiconductor structure according to this embodiment is the semiconductor structure according to the third embodiment after annealing. FIG. 11 is a schematic diagram of the semiconductor structure according to this embodiment. Referring to FIG. 11, the semiconductor structure includes: a substrate 230 and a silicon layer 200, the substrate 230 exposing a top surface of the silicon layer 200; the top surface of the silicon layer 200 being provided with a metal silicide layer 250, the metal silicide layer 250 containing nitrogen atoms, and the farther away from the silicon layer 200, the higher the content of a nitrogen atom.

Specific description is given below with reference to the drawings.

In this embodiment, the metal silicide layer 250 includes cobalt silicide, titanium silicide, titanium cobalt nitride, and titanium silicon nitride. The metal silicide layer 250 may further include a cobalt titanium alloy not completely reacting.

The cobalt silicide has no significant line width effect, titanium silicide has low resistance, and metal silicide layer 250 can combine the advantages of both.

In other embodiments, the metal silicide layer may also include tantalum silicide, tungsten silicide, titanium tungsten nitride, and titanium tantalum nitride. The metal silicide layer may further include a tantalum titanium alloy or a tungsten titanium alloy not completely reacting.

Based on the above, in this embodiment, the metal silicide layer 250 formed includes a variety of metal silicide, which can prevent the high resistance or line width effect of single-metal silicide, thereby improving the performance of the semiconductor structure.

Those of ordinary skill in the art may understand that the above implementations are specific embodiments for implementing the present application. However, in practical applications, various changes in forms and details may be made thereto without departing from the spirit and scope of the present application. Any person skilled in the art can make respective changes and modifications without departing from the spirit and scope of the present application. Therefore, the protection scope of the present application should be subject to the scope defined by the claims.

What is claimed is:

1. A semiconductor structure manufacturing method, comprising:
providing a substrate and a silicon layer, the substrate exposing a top surface of the silicon layer;
performing deposition to form an alloy layer on the silicon layer, the deposition being performed in a nitrogen-containing atmosphere, and a concentration of nitrogen atoms in the nitrogen-containing atmosphere increasing with an increase in deposition time; and
annealing the alloy layer and the silicon layer to form a metal silicide layer.

2. The semiconductor structure manufacturing method according to claim 1, wherein the concentration of nitrogen atoms increases step by step or linearly.

3. The semiconductor structure manufacturing method according to claim 1, wherein the deposition has a variable deposition rate, and the deposition rate decreases with an increase in the deposition time.

4. The semiconductor structure manufacturing method according to claim 3, wherein the deposition rate has a three-stage change interval, and the deposition rates of the change intervals show a linear decreasing function relationship.

5. The semiconductor structure manufacturing method according to claim 4, wherein linear decreasing functions of the deposition rates of the change intervals have different slopes.

6. The semiconductor structure manufacturing method according to claim 1, wherein the deposition, as two-stage deposition, comprises first deposition and second deposition, the first deposition has a first initial nitrogen atom concentration, the second deposition has a second initial nitrogen atom concentration, and the second initial nitrogen atom concentration is greater than the first initial nitrogen atom concentration.

7. The semiconductor structure manufacturing method according to claim 1, prior to the step of forming an alloy layer, further comprising the following step: performing surface treatment on the silicon layer based on a plasma of a first gas and a plasma of a second gas, the first gas comprising an inert gas, the second gas comprising a reducing gas, and a flow rate of the first gas being greater than or equal to that of the second gas.

8. The semiconductor structure manufacturing method according to claim 1, wherein the silicon layer is a polysilicon layer.

9. The semiconductor structure manufacturing method according to claim 1, wherein the alloy layer is made of one or more combinations of titanium alloys, and a titanium content in the alloy layer is no more than 10 at %.

10. The semiconductor structure manufacturing method according to claim 1, wherein the deposition further comprises forming a metal layer on the alloy layer.

11. A semiconductor structure, comprising:
a substrate and a silicon layer, the substrate exposing a top surface of the silicon layer;
a metal silicide layer provided on the top surface of the silicon layer, the metal silicide layer containing nitrogen atoms, and the farther away from the silicon layer, the higher the content of the nitrogen atom,
wherein the metal silicide layer is formed by annealing the silicon layer and an alloy layer formed on the silicon layer, and the alloy layer is formed by performing deposition on the silicon layer in a nitrogen-containing atmosphere, and a concentration of nitrogen atoms in the nitrogen-containing atmosphere increases with an increase in deposition time.

12. The semiconductor structure according to claim 11, wherein the nitrogen atoms increase linearly or step by step.

13. The semiconductor structure according to claim 11, wherein the metal silicide layer comprises a first metal silicide layer and a second metal silicide layer successively stacked, and a nitrogen content in the second metal silicide layer is greater than that in the first metal silicide layer.

14. The semiconductor structure according to claim 11, wherein the silicon layer and the metal silicide layer are configured to form a gate structure.

\* \* \* \* \*